(12) United States Patent
Zhou

(10) Patent No.: US 9,153,480 B2
(45) Date of Patent: Oct. 6, 2015

(54) INTERCONNECT STRUCTURE AND FABRICATION METHOD

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/106,961

(22) Filed: Dec. 16, 2013

(65) Prior Publication Data

US 2014/0167249 A1 Jun. 19, 2014

(30) Foreign Application Priority Data

Dec. 17, 2012 (CN) .......................... 2012 1 0550003

(51) Int. Cl.
| | |
|---|---|
| H01L 21/768 | (2006.01) |
| H01L 23/532 | (2006.01) |
| H01L 21/02 | (2006.01) |
| H01L 21/3105 | (2006.01) |
| H01L 21/311 | (2006.01) |

(52) U.S. Cl.
CPC ...... *H01L 21/76826* (2013.01); *H01L 21/0234* (2013.01); *H01L 21/02203* (2013.01); *H01L 21/02362* (2013.01); *H01L 21/3105* (2013.01); *H01L 21/31144* (2013.01); *H01L 21/7682* (2013.01); *H01L 21/76802* (2013.01); *H01L 21/76829* (2013.01); *H01L 21/76832* (2013.01); *H01L 23/5329* (2013.01); *H01L 23/53295* (2013.01); *H01L 2221/1047* (2013.01)

(58) Field of Classification Search
CPC ..... H01L 23/48; H01L 23/52; H01L 23/5226; H01L 23/5386; H01L 21/7682; H01L 21/02203; H01L 23/53295
See application file for complete search history.

(56) References Cited

U.S. PATENT DOCUMENTS

| | | | | |
|---|---|---|---|---|
| 5,950,101 | A * | 9/1999 | Yano et al. | 438/618 |
| 6,072,227 | A * | 6/2000 | Yau et al. | 257/642 |
| 6,221,745 | B1 * | 4/2001 | Fan | 438/592 |
| 7,279,427 | B2 | 10/2007 | Nishino et al. | |
| 7,851,232 | B2 * | 12/2010 | van Schravendijk et al. | 438/4 |
| 8,173,537 | B1 * | 5/2012 | Chattopadhyay et al. | 438/618 |
| 2002/0076935 | A1 * | 6/2002 | Maex et al. | 438/706 |
| 2003/0111263 | A1 * | 6/2003 | Fornof et al. | 174/262 |
| 2004/0214427 | A1 * | 10/2004 | Kloster et al. | 438/637 |
| 2005/0233591 | A1 * | 10/2005 | Schmitt et al. | 438/706 |
| 2007/0042580 | A1 * | 2/2007 | Al-Bayati et al. | 438/530 |
| 2007/0224824 | A1 * | 9/2007 | Chen et al. | 438/700 |
| 2009/0093112 | A1 * | 4/2009 | Al-Bayati et al. | 438/618 |
| 2010/0136789 | A1 * | 6/2010 | Matz et al. | 438/687 |
| 2012/0306093 | A1 * | 12/2012 | Engel et al. | 257/774 |

* cited by examiner

*Primary Examiner* — Yu-Hsi D Sun
*Assistant Examiner* — Wasiul Haider
(74) *Attorney, Agent, or Firm* — Anova Law Group, PLLC

(57) ABSTRACT

An interconnect structure and fabrication method are provided. A substrate can include a semiconductor device disposed therein. A porous dielectric layer can be formed on the substrate. A surface treatment can be performed to the porous dielectric layer to form an isolation layer on the porous dielectric layer to prevent moisture absorption of the porous dielectric layer. An interconnect can be formed at least through the isolation layer and the porous dielectric layer to provide electrical connection to the semiconductor device disposed in the substrate.

18 Claims, 5 Drawing Sheets

INTERCONNECT STRUCTURE AND FABRICATION METHOD

CROSS-REFERENCES TO RELATED APPLICATIONS

This application claims the priority to Chinese Patent Application No. CN201210550003.3, filed on Dec. 17, 2012, which is incorporated herein by reference in its entirety.

FIELD OF THE DISCLOSURE

The present disclosure generally relates to the field of semiconductor technology and, more particularly, relates to interconnect structures and their fabrication methods.

BACKGROUND

Currently, one of the challenges of integrated circuit design and manufacturing is to reduce resistive capacitive delay during signal transmission. One solution is to replace an aluminum layer with a copper layer to lower the serial metal resistance. Another solution is to form low-k porous films or air gaps between the metal layers to reduce the parasitic capacitance.

FIG. 1 shows a conventional method for fabricating an interconnect structure. The fabrication method includes: providing a substrate 5 and forming semiconductor devices on the substrate 5; depositing a low-k film 4 on the substrate 5; forming a mask 6 on the low-k film 4; patterning the low-k film 4 using the mask 6 to create through-holes (not illustrated); and filling the through-holes with metal to create an interconnect structure connecting to the semiconductor devices. Specifically, the low-k film 4 is porous and the mask 6 is a hard mask.

In practice, however, conventional interconnect structures often have bump defects. Such bump defects may lower production yield of the interconnect structures and may affect electric connection of the interconnect structures.

BRIEF SUMMARY OF THE DISCLOSURE

One aspect of present disclosure includes a method for forming an interconnect structure. A porous dielectric layer can be formed on a substrate having a semiconductor device disposed in the substrate. A surface treatment can be performed to the porous dielectric layer to form an isolation layer on the porous dielectric layer to prevent moisture absorption of the porous dielectric layer. An interconnect can be formed at least through the isolation layer and the porous dielectric layer to provide electrical connection to the semiconductor device in the substrate.

Another aspect of present disclosure includes an interconnect structure having a substrate with a semiconductor device disposed therein. A porous dielectric layer can be disposed on the substrate. An isolation layer can be disposed on the porous dielectric layer by a surface treatment of the porous dielectric layer to prevent moisture absorption of the porous dielectric layer. An interconnect can be disposed at least through the isolation layer and the porous dielectric layer to provide electrical connection to the semiconductor device in the substrate.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It is observed that when a porous dielectric layer is generated in an interconnect structure, the porous dielectric layer is ready to absorb moisture from surrounding environment due to its porosity structure. Residues of the absorbed moisture can be on surface of the porous dielectric layer. Bump defects can be generated on where the moisture is absorbed, upon deposition of other layer(s) on the porous dielectric layer.

Accordingly, the present disclosure provides a method for fabricating an interconnect structure. After creation of a porous dielectric layer, an isolation layer is formed on surface of the porous dielectric layer to protect the porous dielectric layer from absorbing moisture without further generating bump defects. The fabrication method can include, for example, forming a porous dielectric layer on a substrate, performing surface treatment to the porous dielectric layer to form an isolation layer, and forming one or more hard masks on the isolation layer.

FIGS. 2-7 are schematics illustrating an exemplary method for forming an interconnect structure in accordance with various disclosed embodiments.

Figure 1:
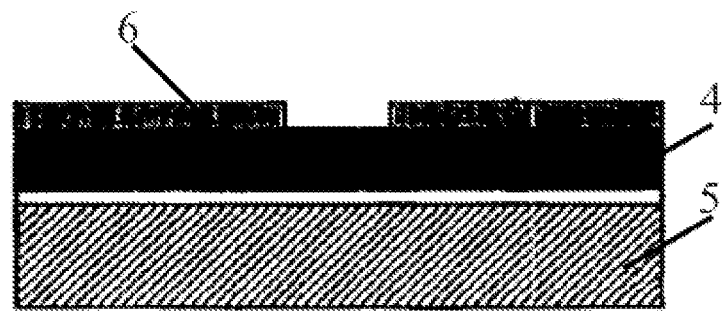
FIG. 1 depicts a conventional method for fabricating an interconnect structure.
Figure 2:
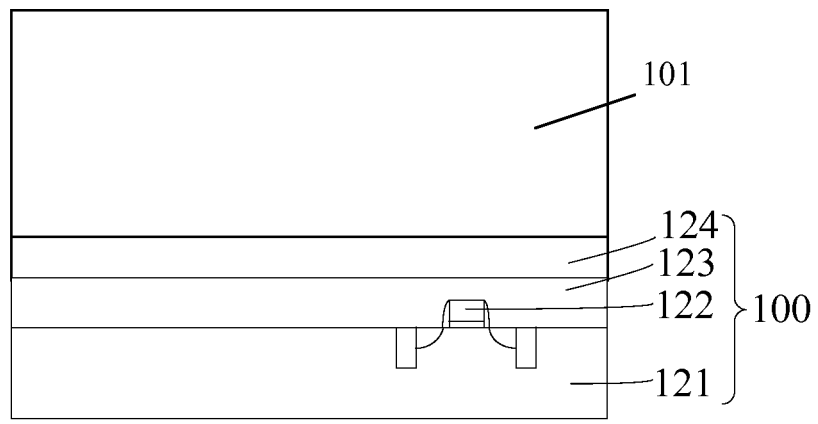
FIGS. 2-7 are schematics illustrating an exemplary method for forming an interconnect structure in accordance with various disclosed embodiments.

In FIG. 2, a substrate 100 is provided including a supporting base 121 having semiconductor devices 122 (e.g. transistors) formed on the supporting base 121; a metal layer 123 formed on the supporting base 121 and the semiconductor devices 122; and a barrier layer 124 formed on the metal layer 123. The metal layer 123 is electrically connected to other semiconductor devices through an interconnect (not illustrated in FIG. 2).

The barrier layer 124 is used to prevent metal diffusion from the metal layer 123. In one embodiment, the metal layer 123 is made of copper and/or aluminum, and the barrier layer 124 is made of nitrogen-doped silicon carbide (NDC). However, the materials used for the metal layer 123 and the barrier layer 124 are not limited in accordance with various embodiments.

Still as shown in FIG. 2, a dielectric material 101 is deposited on the substrate 100. In this exemplary embodiment, the dielectric material 101 is resulted from dimethyldiethoxysilane and atom transfer radical polymerization. For example, a sol-gel process can be employed to form the dielectric material 101. In other embodiments, the dielectric material 101 can be made of $SiO_2$, SiOF, SiCOH, SiO, SiCO, SiCON, and/or black diamond(s). A chemical vapor deposition process can be used to deposit the dielectric material 101. The materials and methods used for making the dielectric material 101 are not limited.

Figure 3:
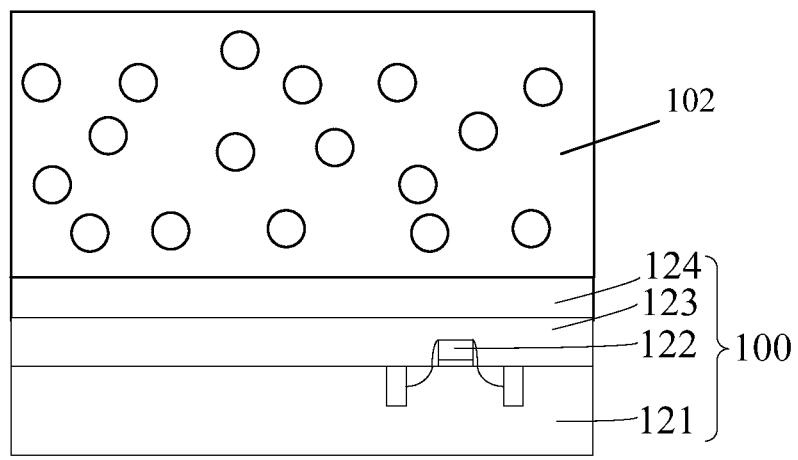

In FIG. 3, the dielectric material 101 is UV treated to form a porous dielectric layer 102. For example, a porous structure is developed in the dielectric material in response to the UV light and/or the UV-generated heat to form a porous dielectric layer 102. The methods used for forming the porous dielectric layer 102 are not limited. Any other suitable methods can be employed to form the porous dielectric layer 102.

Figure 4:
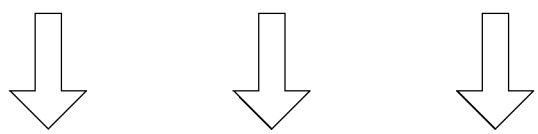
Figure 4:
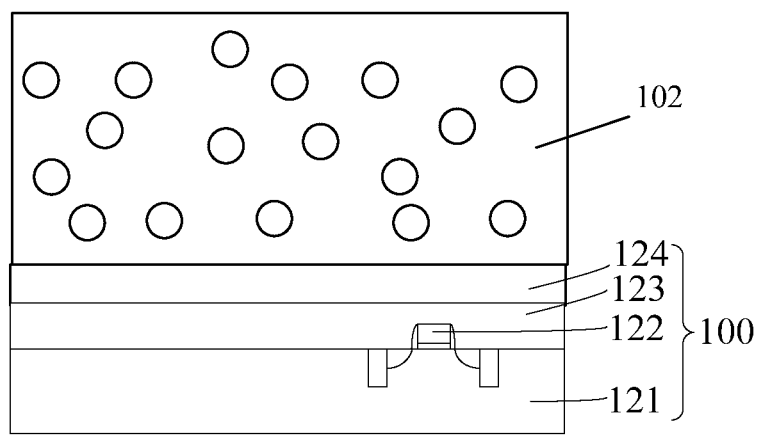
Figure 5:
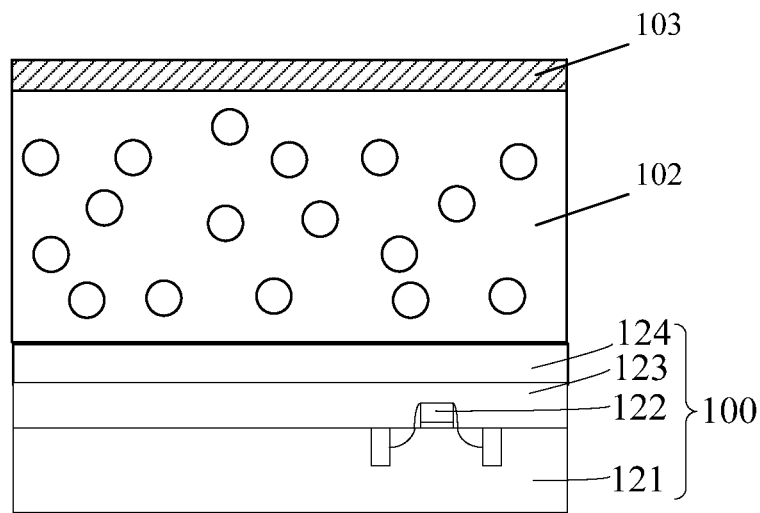

Referring to FIGS. 4 and 5, surface treatment is performed on the porous dielectric layer 102 to create an isolation layer 103. Such isolation layer 103 is utilized to reduce or eliminate moisture uptake on the porous dielectric layer 102. In an exemplary embodiment, the isolation layer 103 is a dense film containing C, H, O, and/or Si, although other element(s) can be included in the isolation layer 103. As long as the isolation layer 103 is denser than the porous dielectric layer 102, moisture absorption by the porous dielectric layer 102 can be reduced or eliminated. Accordingly, bump defects in the interconnect structure can be avoided.

In an exemplary embodiment, the surface treatment for forming the isolation layer 103 can be performed using ozone and dimethyldiethoxysilane (e.g., which can include octamethylcyclotetrasiloxane, tetraethyl orthosilicate, and/or silane). The formed isolation layer 103 can thus be made of $C_5H_{14}O_2Si$. The isolation layer 103 has a density sufficiently high to prevent moisture absorption. The materials used for the surface treatment and/or for constituting the isolation layer 103 are not limited. Other suitable materials and/or treatment processes can be employed for forming the isolation layer 103. For instance, an isolation layer 103 can be made of silicon dioxide.

It should be noted that excessive supply of ozone and/or dimethyldiethoxysilane is wasteful, while insufficient supply thereof can reduce isolation effectiveness of the isolation layer 103. Accordingly, the surface treatment utilizing ozone and dimethyldiethoxysilane can include a chamber pressure ranging from about 4 torr to about 7 torr, a power from about watts 50 to about 500 watts, and a flow rate of ozone and dimethyldiethoxysilane from about 100 sccm to about 1000 sccm. The carrier gas used can be gas He with a flow rate of about 100 sccm to about 2000 sccm. However, other suitable carrier gas(es) can be used without limitation, for example, the carrier gas can include Ar.

In one embodiment, surface treatment using ozone and dimethyldiethoxysilane can be conducted in-situ on the porous dielectric layer 102 in a same chamber used for the UV treatment process, such that there is no need to move the interconnect structure from the vacuum chamber for forming the porous dielectric layer 102 to any other chambers for forming the isolation layer 103. The in-situ surface treatment process allows a simplified process with reduced fabrication steps. In other embodiments, the surface treatment for forming the isolation layer 103 may not be carried out in situ in the UV-treatment process chamber for forming the porous dielectric layer 102 and may be performed in a separate reaction chamber using a separate processing step.

In various embodiments, prior to the surface treatment employing ozone and dimethyldiethoxysilane for forming the isolation layer 103, pre-treatment using ozone can be performed on the porous dielectric layer 102. Such pre-treatment using ozone on the porous dielectric layer 102 can enhance the adhesion between the formed isolation layer 103 and the porous dielectric layer 102. This provides a more compact bonding between the isolation layer 103 and the porous dielectric layer 102 compared with the semiconductor structure without using pre-treatment on the porous dielectric layer 102. Quality and mechanical strength of the formed semiconductor structure can be enhanced, and moisture penetration/bump defects can be prevented.

Excessive ozone supply can be wasteful, while insufficient ozone supply cannot improve the adhesion between the isolation layer 103 and the porous dielectric layer 102. Accordingly, the pre-treatment using ozone can use a chamber pressure ranging from about 4 torr to about 7 torr, a power ranging from about 50 watts to about 500 watts, and a flow rate ranging from about 100 sccm to about 1000 sccm. Also, the pre-treatment process using ozone can be performed in-situ on the porous dielectric layer 102 in the UV-treatment chamber.

Figure 6:
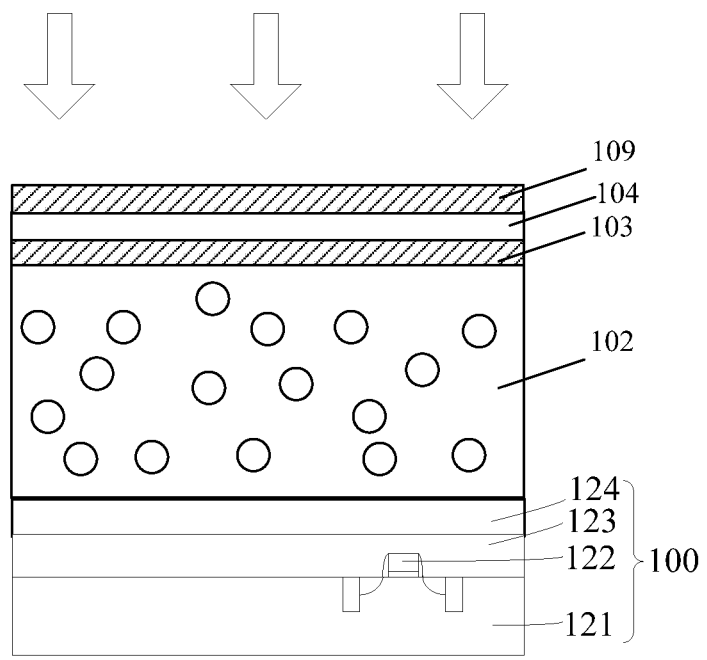
Figure 7:
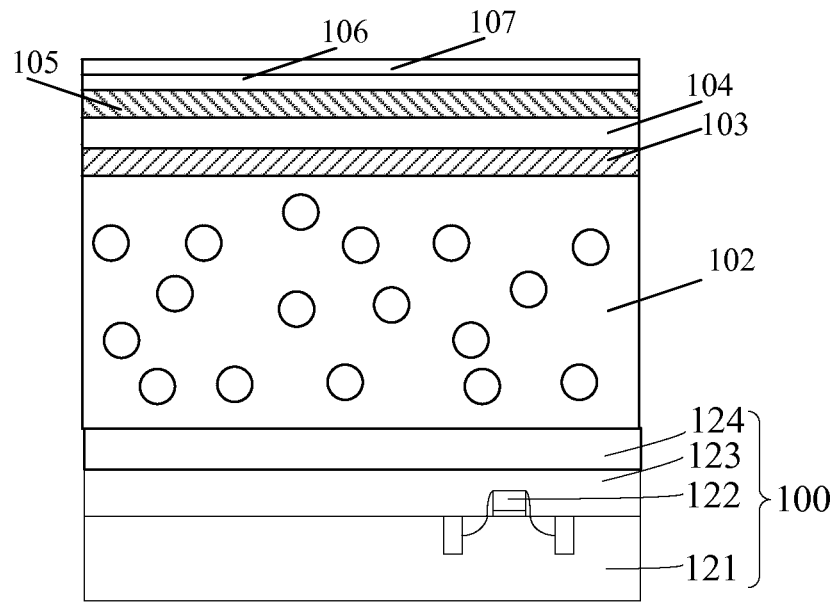

As shown in FIGS. 6-7, hard mask layers are formed on the isolation layer 103. For example, a porous dielectric hard mask 104, a TEOS (i.e., tetraethyl orthosilicate, $Si(OC_2H_5)_4$) hard mask 105, a metal hard mask 106, and a silicon oxide hard mask 107 are sequentially formed on the isolation layer 103, as shown in FIG. 7. Each hard mask layer (e.g., 104, 105, 106, or 107) can be omitted, modified, and rearranged. Other suitable layer(s) or hard mask layer(s) can be added.

For example, after the porous dielectric hard mask 104 is formed on the isolation layer 103 as shown in FIG. 6, surface treatment can be performed on the porous dielectric hard mask 104 to optionally generate a second isolation layer 109 on the porous dielectric hard mask 104 to further reduce moisture uptake by the porous dielectric layer 102 to further reduce or eliminate bump defects formed thereon. Such surface treatment can be performed using ozone and dimethyldiethoxysilane (e.g., the dimethyldiethoxysilane can include octamethylcyclotetrasiloxane, tetraethyl orthosilicate, and silane) to generate the optional second isolation layer 109 made of $C_5H_{14}O_2Si$. For example, this surface treatment on the porous dielectric hard mask 104 can be performed having a chamber pressure ranging from about 4 torr to about 7 torr, a power ranging from about 50 watts to about 500 watts, a flow rate ranging from about 100 sccm to about 1000 sccm for ozone and dimethyldiethoxysilane, and a flow rate ranging from about 100 sccm to about 2000 sccm for a carrier gas (e.g., He).

In some embodiments, pre-treatment using ozone can be performed prior to the surface treatment of the porous dielectric hard mask 104. For example, ozone and dimethyldiethoxysilane can be employed to enhance adhesion between the isolation layer (not illustrated) and the porous dielectric hard mask 104. This further provides a more compact bonding between the isolation layer and the porous dielectric hard mask 104. Quality and mechanical strength of the formed semiconductor structure can further be enhanced, and moisture penetration/bump defects on the porous dielectric layer 102 can be prevented. In one embodiment, such pre-treatment on the porous dielectric hard mask 104 can use a chamber pressure ranging from about 4 torr to about 7 torr, a power ranging from about 50 watts to about 500 watts, and a flow rate ranging from about 100 sccm to about 1000 sccm.

An interconnect 131 can then be formed at least through the isolation layer 103, the porous dielectric layer 102, and the barrier layer 124 to connect to the metal layer 123 such that the interconnect 131 can provide electrical connection between the semiconductor device 122 and other semiconductor devices.

Figure 8A:
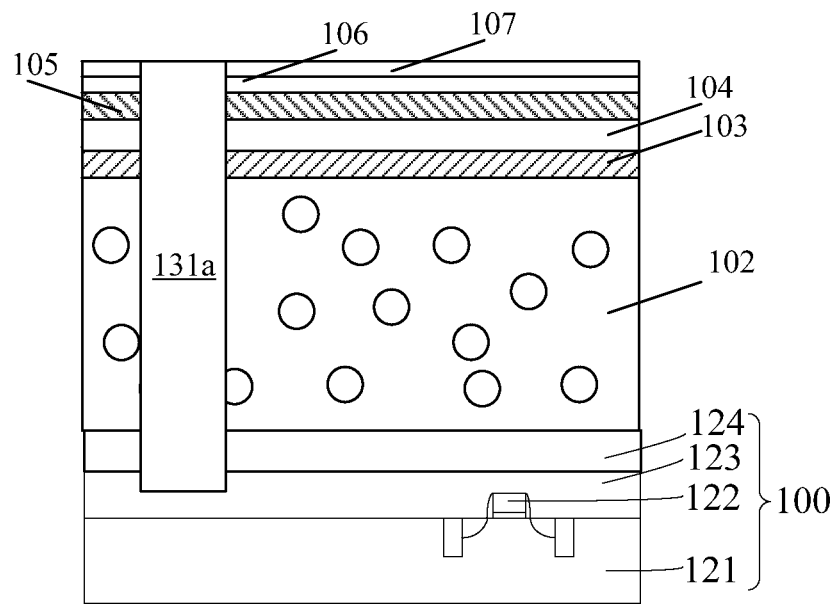
FIGS. 8A-8C depict exemplary interconnect structures in accordance with various disclosed embodiments.

For example, the hard masks 104, 105, 106, and/or 107 in FIG. 7 can be patterned and used as an etch mask to form a through-hole at least through the isolation layer 103, the porous dielectric layer 102, the barrier layer 124 in the substrate 100, and/or a portion of the metal layer 123 in the substrate 100 by suitable etching process(es) to expose the metal layer 123 in the substrate 100. The through-hole can then be filled with metal material to form an electrical interconnection, such as the interconnect 131a as shown in FIG. 8A.

Figure 8B:
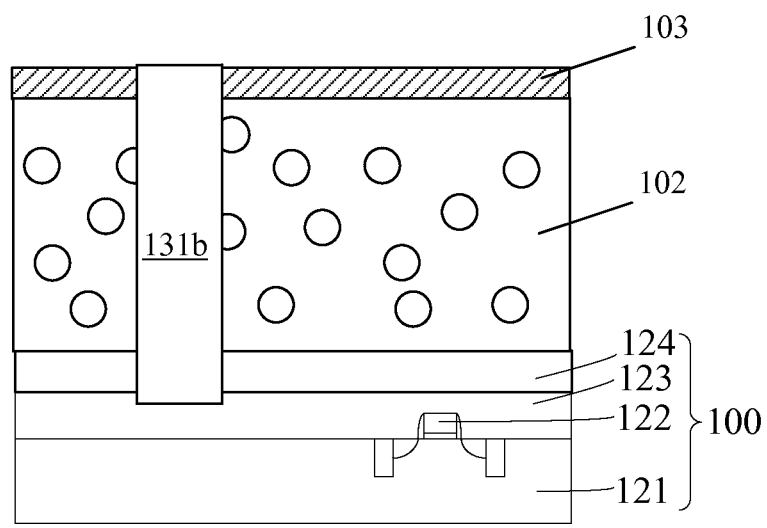

In various embodiments, one or more layers of the hard masks 104, 105, 106, and/or 107 can be selected and removed from the processed structure. For example, as shown in FIG. 8B, all of the hard masks can be removed to expose the isolation layer 103 for manufacturing an interconnection 131b through the isolation layer 103, the porous dielectric layer 102, the barrier layer 124, and/or a portion of the metal layer 123 to connect to the metal layer 123. The interconnection 131b can electrically connect the semiconductor device 122 and other suitable semiconductor devices (not shown).

In other examples, the hard masks 107, 106, and/or 105 can be removed depending on specific requirements for the interconnect structure, e.g., for forming a device having a compact structure (not shown) including an interconnect formed through the porous dielectric hard mask 104, the isolation layer 103, the porous dielectric layer 102, and the barrier layer 124 to connect to the metal layer 123.

Figure 8C:
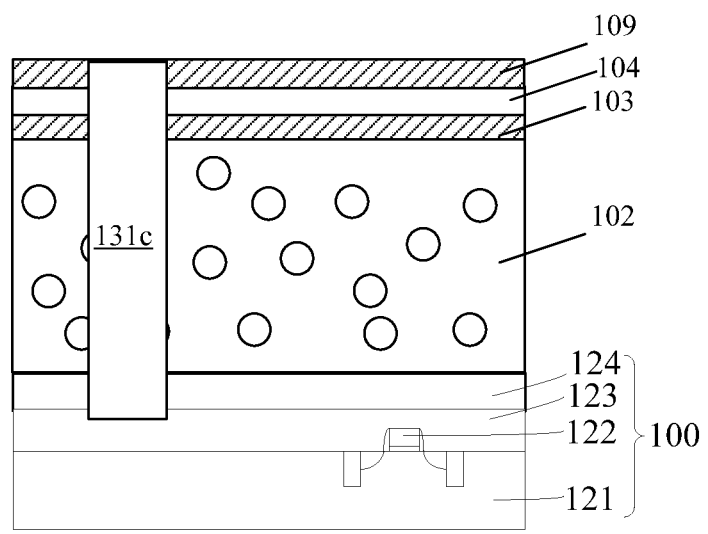

In still other examples, alternating layers of an isolation layer (e.g., 109, 103, etc.) and a porous dielectric layer (e.g., 104, 102, etc.) can be formed on the substrate 100. An interconnect (e.g., interconnect 131c as shown in FIG. 8C) can be formed through a plurality of the alternating layers (including an isolation layer and a porous dielectric layer), the barrier layer 124, and a portion of the metal layer 123 to establish electrical connections between the semiconductor device 122 and other suitable semiconductor devices (not shown).

The interconnect structures and their fabrication methods can reduce or eliminate bump defects formed on the porous dielectric layer to increase production yield of the interconnect structures and to improve electrical connection reliability of the interconnect structures.

Other applications, advantages, alternations, modifications, or equivalents to the disclosed embodiments are obvious to those skilled in the art.

What is claimed is:

1. A method for fabricating an interconnect structure, comprising:
   providing a substrate comprising a semiconductor device disposed therein;
   forming a porous dielectric layer on the substrate;
   performing a first surface treatment to convert a top portion of the porous dielectric layer into an isolation layer on remaining porous dielectric layer, such that the isolation layer converted from the top portion of the porous dielectric layer has a density sufficiently higher than the remaining porous dielectric layer to prevent moisture absorption of the porous dielectric layer,
      wherein, prior to performing the first surface treatment, a pre-treatment is performed on the to portion of the porous dielectric layer to compact the to-be-formed isolation layer with the remaining porous dielectric layer to prepare the top portion of the porous dielectric layer for the first surface treatment, wherein the pre-treatment uses ozone; and
   forming an interconnect at least passing through the isolation layer and passing through the remaining porous dielectric layer to provide electrical connection to the semiconductor device in the substrate.

2. The method of claim 1, wherein the first surface treatment is performed employing ozone and dimethyldiethoxysilane on the top portion of the porous dielectric layer.

3. The method of claim 1, wherein the step of performing the first surface treatment to convert the top portion of the porous dielectric layer into the isolation layer on the remaining porous dielectric layer uses a chamber pressure ranging from about 4 torr to about 7 torr, a power ranging from about 50 watts to about 500 watts, a flow rate ranging from about 100 sccm to about 1000 sccm for ozone and dimethyldiethoxysilane, and a flow rate ranging from about 100 sccm to about 2000 sccm for a carrier gas He.

4. The method of claim 1, wherein the pre-treatment by ozone uses a chamber pressure ranging from about 4 torr to about 7 torr, a power ranging from about 50 watts to about 500 watts, and a gas flow rate ranging from about 100 sccm to about 1000 sccm.

5. The method of claim 1, wherein the isolation layer contains C, H, O, and Si comprising $C_5H_{14}O_2Si$.

6. The method of claim 1, wherein the porous dielectric layer is formed by:
   depositing a dielectric material on the substrate; and
   applying a UV treatment on the dielectric material to produce pores in the dielectric material to turn the dielectric material into the porous dielectric layer to form the porous dielectric layer.

7. The method of claim 6, wherein the step of performing the first surface treatment to convert the top portion of the porous dielectric layer into the isolation layer is performed in situ in a UV-treatment chamber for the UV-treatment for forming pores in the dielectric material to form the porous dielectric layer.

8. The method of claim 6, wherein the dielectric material is formed by a sol-gel process and comprises $SiO_2$, SiOF, SiCOH, SiO, SiCO, and SiCON.

9. The method of claim 1, wherein the porous dielectric layer is a black diamond.

10. The method of claim 1, wherein the pre-treatment using ozone and the first surface treatment using are performed in-situ in a UV-treatment chamber for producing pores in a dielectric material to form the porous dielectric layer.

11. A method for fabricating an interconnect structure, comprising:
   providing a substrate comprising a semiconductor device disposed therein;
   forming a porous dielectric layer on the substrate;
   performing a first surface treatment to convert a top portion of the porous dielectric layer into an isolation layer on remaining porous dielectric layer, such that the isolation layer converted from the to portion of the porous dielectric layer has a density sufficiently higher than the remaining porous dielectric layer to prevent moisture absorption of the porous dielectric layer;
   forming a porous dielectric hard mask on the isolation layer;
   forming a tetraethyl orthosilicate (TEOS) hard mask on the porous dielectric hard mask;
   forming a metal hard mask on the TEOS hard mask;
   forming a silicon oxide hard mask on the metal hard mask; and
   forming an interconnect at least passing through the isolation layer and Passing through the remaining porous dielectric layer to provide electrical connection to the semiconductor device in the substrate.

12. The method of claim 11, further comprising:
   performing a second surface treatment to convert a top portion of the porous dielectric hard mask into a second isolation layer on remaining porous dielectric hard mask, such that the second isolation layer converted from the top portion of the porous dielectric hard mask has a density sufficiently high to prevent moisture absorption of the remaining porous dielectric layer and to reduce bump effects to be formed thereon.

13. The method of claim 12, prior to performing the second surface treatment on the top portion of the porous dielectric hard mask, further comprising:
   performing a second pre-treatment using ozone on the top portion of the porous dielectric hard mask to compact the formed second isolation layer with the porous dielectric hard mask.

14. The method of claim 13, wherein the second pre-treatment using ozone has a chamber pressure ranging from about 4 torr to about 7 torr, a power ranging from about 50 watts to about 500 watts, and a gas flow rate ranging from about 100 sccm to about 1000 sccm.

15. The method of claim 12, further comprising:
employing ozone and dimethyldiethoxysilane on the top portion of the porous dielectric hard mask for the second surface treatment.

16. The method of claim 12, wherein the second surface treatment to convert a top portion of the porous dielectric hard mask into the second isolation layer uses a chamber pressure ranging from about 4 torr to about 7 torr, a power ranging from about 50 watts to about 500 watts, a flow rate ranging from about 100 sccm to about 1000 sccm for ozone and dimethyldiethoxysilane, and a flow rate ranging from about 100 sccm to about 2000 sccm for a carrier gas He.

17. A method for fabricating an interconnect structure, comprising:
providing a substrate comprising a semiconductor device disposed therein;
forming a porous dielectric layer on the substrate;
performing a first surface treatment to convert a top portion of the porous dielectric layer into an isolation layer on remaining porous dielectric layer, such that the isolation layer converted from the to portion of the porous dielectric layer has a density sufficiently higher than the remaining porous dielectric layer to prevent moisture absorption of the porous dielectric layer; and
forming an interconnect at least passing through the isolation layer and passing through the remaining porous dielectric layer to provide electrical connection to the semiconductor device in the substrate, wherein:
the substrate further comprises a barrier layer formed on a metal layer, the metal layer being electrically connected to the semiconductor device, and
the interconnect is formed at least passing through the isolation layer, the remaining porous dielectric layer, and the barrier layer on the metal layer.

18. The method of claim 17, wherein the isolation layer contains C, H, O, and Si comprising $C_5H_{14}O_2Si$, and the porous dielectric layer is a black diamond.

* * * * *